(12) United States Patent
Kainuma et al.

(10) Patent No.: US 6,257,319 B1
(45) Date of Patent: Jul. 10, 2001

(54) IC TESTING APPARATUS

(75) Inventors: Tadashi Kainuma; Noboru Masuda; Haruki Nakajima; Noriyuki Igarashi; Yuichi Nansai, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/357,906

(22) Filed: Jul. 21, 1999

(30) Foreign Application Priority Data

Jul. 24, 1998 (JP) .................................................. 10-209631
Jul. 24, 1998 (JP) .................................................. 10-209633
Jul. 24, 1998 (JP) .................................................. 10-209634

(51) Int. Cl.$^7$ .......................... G01R 31/02; G01N 25/00
(52) U.S. Cl. .......................... 165/11.1; 62/11.1; 324/760; 374/45
(58) Field of Search .................................. 62/151, 176.5, 62/173, 186, 380, 180, 408; 324/500, 537, 760; 73/865.6; 165/11.1, 11.2

(56) References Cited

U.S. PATENT DOCUMENTS

| | | | |
|---|---|---|---|
| 4,854,726 | * | 8/1989 | Lesley et al. .......................... 374/45 |
| 4,926,118 | * | 5/1990 | O'Connor et al. ................ 324/158 F |
| 5,065,089 | * | 11/1991 | Rich ................................... 324/158 F |
| 5,184,068 | * | 2/1993 | Twigg et al. ...................... 324/158 F |
| 5,187,432 | * | 2/1993 | Bauernfeind et al. ........... 324/158 R |
| 5,220,956 | * | 6/1993 | Noble, Jr. et al. .................... 165/80.2 |
| 5,966,940 | * | 10/1999 | Gower et al. ............................ 62/3.3 |
| 5,977,785 | * | 11/1999 | Burward-Hoy ...................... 324/760 |
| 5,984,524 | * | 11/1999 | Teshirogi et al. ....................... 374/55 |

\* cited by examiner

Primary Examiner—William Wayner
(74) Attorney, Agent, or Firm—Birch, Stewart, Kolasch & Birch, LLP

(57) ABSTRACT

An IC testing apparatus 1 for performing a test by applying at least a low temperature stress to ICs to be tested comprising a refrigerant cycle 210 wherein at least a compressor 211, condenser 212, expansion valve 214 and evaporator 215 are connected in this order, and a cold air applying line 220 having a blower 223 for supplying heat exchanged cold air by the evaporator 215 to the ICs to be tested.

12 Claims, 10 Drawing Sheets

IC TESTING APPARATUS

BACKGROUND OF THE INVENTION

1. Field of the Invention

The present invention relates to an IC testing apparatus for testing a variety of electric parts, such as semiconductor integrated circuit devices (hereinafter referred to as an "IC" or "ICs"), particularly relates to an IC testing apparatus having a device for giving a low temperature thermal stress.

2. Description of the Related Art

An IC testing apparatus called a "handler" conveys a large number of ICs held on a tray to the inside of a testing apparatus where the ICs are made to electrically contact a test head, then the IC testing unit (hereinafter, also referred to as a tester) is made to perform the test. When the test is ended, the ICs are conveyed out from the test head and reloaded on trays in accordance with the results of the tests so as to classify them into categories of good ICs and defective ones.

When roughly dividing handlers of the related arts in terms of forms of giving a thermal stress, there are handlers of a chamber form in which the ICs to be tested are reloaded to an exclusive tray called a test tray, transferred into a thermal stress applying chamber and made to become a predetermined temperature before being pressed against a test head in a state being carried on the test tray, and handlers of a heat plate form in which the ICs to be tested are carried on a heat plate (also referred to as a hot plate) to be given a high temperature thermal stress and are pressed against the test head while a plurality of the ICs are simultaneously picked up by a pick-up head.

Especially, when testing by giving a low temperature thermal stress, a handler of the chamber form is mainly used, wherein a low temperature stress of for example about –30° C. is given to the ICs by introducing liquid nitrogen into the chamber.

When giving a low temperature stress at a handler, a supply source of liquid nitrogen is necessary as explained above. In the related art, it was drawn to the handler from a liquid nitrogen storage provided separately from the handler by using a plant piping system, or it was supplied by providing a liquid nitrogen cylinder near the handler to supply it to the handler through pipes, etc.

When configuring to press to send the liquid nitrogen by plant pipes from the liquid nitrogen storage provided separately from the handler, however, there have been disadvantages that a space for handling the plant pipes became limited and costs on the equipment for heat-retention and others, became high. Although such disadvantages can be solved when providing the liquid nitrogen cylinder near the handler, a new disadvantage like troublesomeness of exchanging the cylinder arises.

Further, since liquid nitrogen is a substance which has to be handled with precautions and cannot be used carelessly. Thus, it is necessary to be aware of sufficient countermeasures which also ends up in an increase of the cost.

Accordingly, inventors of the present invention developed an IC testing apparatus having a equipment for giving a thermal stress in place for liquid nitrogen. However, the thermal stress applying equipment and the handler have to be connected by a duct, etc. in order to supply a cold air from the thermal stress applying equipment to the thermal stress applying chamber. In such a case, since the duct has to be removed for maintenance of the inside of the thermal stress applying chamber and exchange of a change kit, it has been demanded to develop along with it the connection structure of the duct capable of keeping a sufficient air tightness and being detached and attached easily.

SUMMARY OF THE INVENTION

An object of the present invention is to provide an IC testing apparatus having a thermal stress applying equipment in place for liquid nitrogen.

(1) According to the first aspect of the present invention, there is provided an IC testing apparatus for testing by applying at least a low temperature thermal stress to an electronic device to be tested comprising:

a refrigerant cycle wherein at least a compressor, a condenser, an expansion valve and an evaporator are connected in this order by a refrigerant lines;
 a cold air applying line having a blower for supplying heat exchanged air by the evaporator to the pre-test electronic device to be tested.

In the IC testing apparatus of the present invention, since low temperature thermal stress is applied to the electronic device to be tested by generating a cold air in a refrigerating circle, all of the disadvantages can be solved, such as disadvantages on a space for handling plant pipes, equipment costs, and a security comparing with a case using liquid nitrogen.

(2) In the above invention, it is not particularly limited but the cold air applying line preferably supplies the cold air to either one of the soak chamber for raising or lowering the temperature of the electronic device to be tested and the test chamber for testing the electronic device to be tested, and discharges the air from the other.

In the IC testing apparatus of the present invention, the cold air from the cold air applying line may be flown from the soak chamber to the test chamber or inversely from the test chamber to the soak chamber.

By supplying the cold air from the cold air applying line to the soak chamber and discharging it from the test chamber, the efficiency of raising or lowering the temperature of the electronic device to be tested improves in the soak chamber. Also, by introducing the cold air supplied to the soak chamber to the test chamber, it is possible to contribute to maintain the temperature in the test chamber.

Inversely, by supplying the cold air from the cold air applying line to the test chamber and discharging it from the soak chamber, the cold air of a suitable temperature is supplied to the test chamber where a temperature controlling is needed most. Thus, the temperature accuracy of the electronic device to be tested improves. Also, by introducing the cold air supplied to the test chamber to the soak chamber and discharging it therefrom, it also contributes to controlling of raising or lowering a temperature in the soak chamber.

(3) In the above invention, it is not particularly limited, but preferably, the cold air supplying line further comprises a heating unit for heating heat exchanged air by the evaporator.

To control the temperature of the cold air only by the refrigerating cycle, it is sufficient to control the amount of the refrigerant circulating in the evaporator and the rotation rate of the blower, etc. However, since the IC testing apparatus of the present invention comprises a heating unit, it is sufficient to heat the cold air after passing the evaporator to raise the temperature exactly as desired. Accordingly, it is easy to control the temperature of the cold air accurately.

(4) In the above invention, it is not particularly limited, but preferably comprises an input means for inputting a set temperature; a temperature sensor provided on at least either one of the test chamber or the soak chamber; and a control means for controlling a temperature of the cold air supplied from the cold air applying line based on an actual temperature detected by the temperature sensor and the set temperature input to the input means.

In the IC testing apparatus of the present invention, the actual temperature of the chamber being supplied the cold air is detected and compared with the set temperature and thereby the temperature of the cold air supplied from the cold air supplying line is controlled. Therefore, the temperature can be controlled accurately and reliability of tests of electronic device improves.

(5) In the above invention, it is not particularly limited, but the control means preferably controls the temperature of the cold air supplied from the cold air applying line by controlling the blower and/or the heating unit.

As explained above, the temperature of the cold air supplied form the cold air applying line is properly adjustable by the supply amount of the cold air by the blower or heating of the cold air by the heating unit, or by combination of the two.

(6) In the above invention, it is not particularly limited, but preferably comprise an operation condition detection means for detecting operation conditions of at least either one of said refrigerant cycle or said cold air applying line, and a control means for controlling start or stop of an operation of said refrigerant cycle or said cold air applying line based on an output of said operation condition detection means.

In the IC testing apparatus of the present invention, operation conditions of at least either one of the refrigerating cycle or the cold air applying line is detected by the operation condition detection means which stops the refrigerating cycle or the cold air applying line when an abnormality is detected. At this time, it is preferable to notify an operator of the condition. By doing so, it is possible to prevent electronic device to be tested from being tested under an inappropriate temperature condition, reliability of the test improves, and yields of the IC testing apparatus also improves.

(7) According to a second aspect of the present invention, there is provided an IC testing apparatus comprising a handler for transferring an electronic device to be tested to a test portion and classifying the electronic device after performing at least a low temperature test in response to a result of the test; and a refrigerant equipment having a refrigerant cycle and a cold air applying line for supplying heat exchanged air by the refrigerating cycle to a pre-test electronic device to be tested;

wherein the normal temperature restoring operation of said handler and the defrost operation of said refrigerant equipment are interlocked to be carried out.

In an IC testing apparatus for low temperature tests, when types of electronic devices to be tested is changed and a match plate, etc. are to be exchanged, it is necessary to restore the testing procedure from the low temperature environment to the normal temperature environment prior to the exchange. Also, as to the refrigerant equipment, it is necessary to remove the frosts adhered on the refrigerant lines and the cold air lines by performing a defrost operation at predetermined intervals. At the time of performing the restoring operation to the normal temperature on the handler and the defrost operation on the refrigerant equipment, since the both operations are interlocked to be carried out in the IC testing apparatus of the present invention, inputting to only either one of them is sufficient. Accordingly, it can avoid forgetting to start either one of the operations, a preparing time can be efficiently used, and it can contribute to improve the rate of operation.

Note that in the IC testing apparatus of the present invention, low temperature thermal stress is applied to the electronic device to be tested by generating a cold air by the refrigerating cycle, so there are advantages that all of the disadvantages can be solved regarding the space for handling the plant pipes, equipment costs, security, etc. comparing with a case of using liquid nitrogen.

(8) In the above invention, a specific means is not particularly limited for interlocking the restoring operation to the normal temperature on the handler and the defrost operation on the refrigerant equipment. However, as an embodiment, it is preferable that a start instruction signal of the defrost operation is sent from the handler to the refrigerant equipment when the handler carries out the normal temperature restoring operation.

When the start instruction for normal temperature restoring operation is input to the handler side, a low temperature application by the refrigerant equipment becomes unnecessary, so an instruction signal to start a defrost operation is sent to the refrigerant equipment side. As a result, it is possible to almost simultaneously carry out the normal temperature restoring operation and the defrost operation.

(9) When the refrigerant equipment carries out the defrost operation, it is preferable that a start instruction signal for the normal temperature restoring operation is sent to the handler from the refrigerant equipment.

When the start instruction for the defrost operation is input to the refrigerant equipment side for some reason or other, the low temperature cannot be applied, so an instruction signal to start the normal temperature restoring operation is sent to the handler side from the refrigerant equipment side and the handler side also starts the normal temperature restoring operation. During this time, the electronic device being under tested are sorted to a category for retesting. In this way, it is possible to start performing the normal temperature restoring operation and the defrost temperature almost simultaneously.

(10) Furthermore, when the normal temperature restoring operation is completed, it is preferable that a stop instruction signal for the defrost operation is sent to the refrigerant equipment from the handler.

Depending on IC testing apparatuses, a time required for restoring the handler to the normal temperature is longer than the time required for defrosting the refrigerant equipment in some cases while it is shorter in other cases. In a case where a time for restoring to the normal temperature the handler is shorter, when restoration of the handler to the normal temperature is completed, the defrost operation is forcibly stopped even though the defrosting of the refrigerant equipment is incomplete and the refrigerant equipment comes to be prepared to start the next low temperature application. By doing so, the rate of operation of the IC testing apparatus is improved.

(11) According to a third aspect of the present invention, there is provided an IC testing apparatus comprising a handler for transferring the electronic device to be tested to a temperature applying chamber and after performing a test by applying a thermal stress, classifying the electronic device to be tested in accordance with the results of the tests; a temperature applying device for generating cold air or hot air to be supplied to the temperature applying chamber; and a duct connected between the handler and the temperature applying device; comprises a first housing provided at the air through hole formed in the temperature applying chamber of the handler, to which an end of the duct is connected;

a second housing attached to the one end of the duct and is jointed to the first housing via a sealing body; and a fixing means for fixing the first housing and the second housing by tightening.

At this time, it is not particularly limited but joint of the first housing and the second housing is preferably configured to insert only in the direction of the duct axis, and the fixing means for fixing by tightening the first housing and the second housing is preferably configured to relatively press the first housing and the second housing in the direction of the duct axis.

In the IC testing apparatus of the present invention, the first housing and the second housing are jointed and tightened to be fixed by the fixing means with one touch of operation. Also, the air tightness of the duct and the temperature applying chamber of the handler is maintained by a sealing body. If the configuration is made to be jointed and pressed only in the direction of the duct axis, there is no fear that the sealing body twists and attaching and detaching operation becomes extremely easy, as well.

(12) In the above invention, it is not particularly limited but the first and the second housings are preferably formed by a synthetic resin.

In the IC testing apparatus of the present invention, since the first and the second housings are formed by synthetic resin, heat insulation of heated air passing through the duct is secured, an excellent heat efficiency can be obtained and it contributes to prevent condensation.

(13) In the above invention, it is not particularly limited, but preferably, one end of the duct is airtightly attached to the second housing via a tightening band.

The one end of the duct and the second housing are not necessary to be detached, so if they are firmly fixed by the tightening band, the air tightness can be secured.

In the above invention, as a fixing means for tightening the first housing and the second housing to be fixed, for example a toggle clamp and a crescent can be mentioned.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will be explained in more detail below with reference to the attached drawings which are given by way of illustration only, and thus are not limitative of the present invention, and wherein.

DESCRIPTION OF THE PREFERRED EMBODIMENTS

Handler 10

Figure 3:
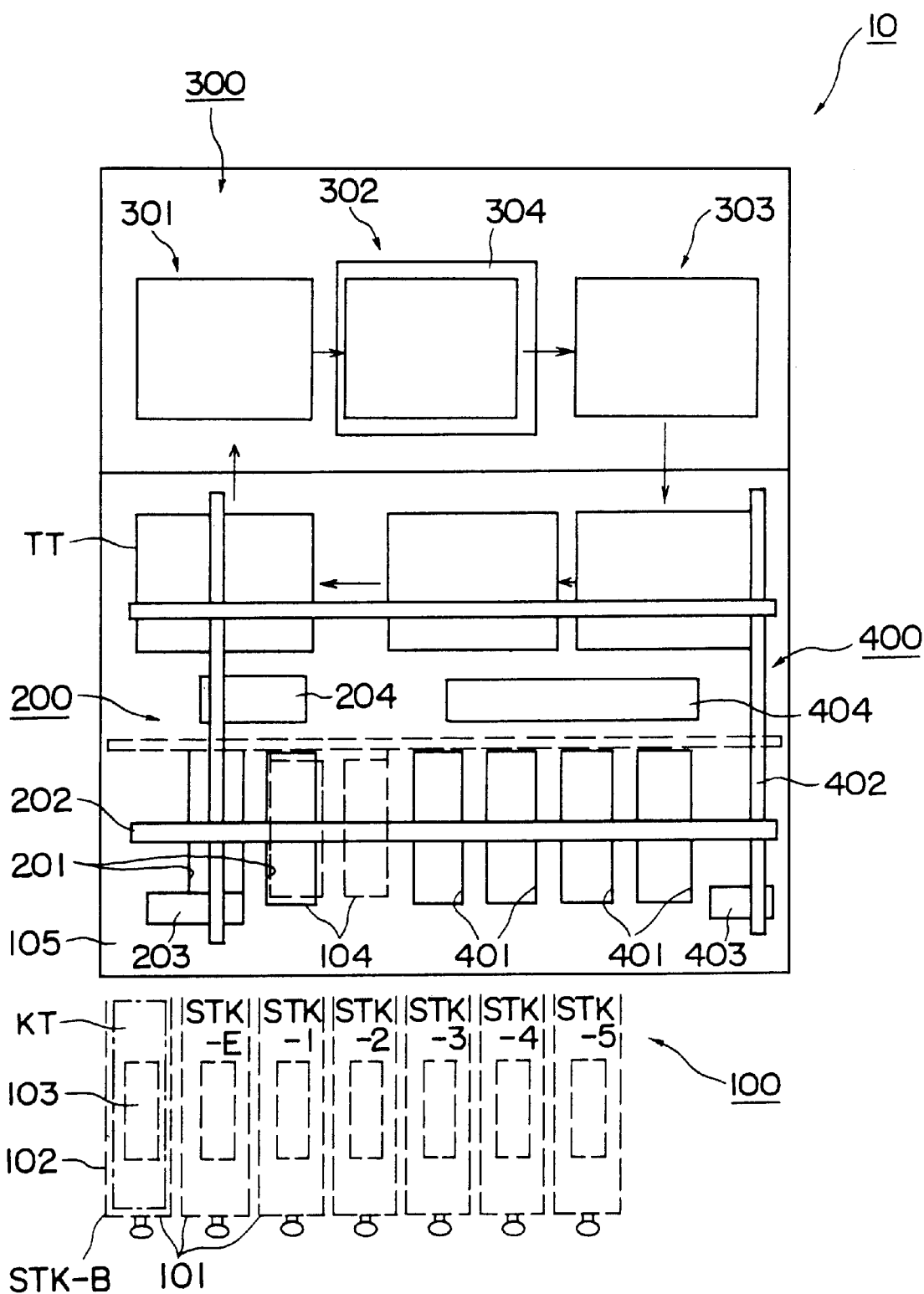
FIG. 3 is a flow chart of a tray showing a methods of handling ICs to be tested in the IC testing apparatus in FIG. 1.

First, a methods of handling ICs to be tested in a handler 10 will be explained with reference to a flow chart of FIG. 3. Note that FIG. 3 is a view for understanding the methods of handling the ICs to be tested and in which members actually aligned in the vertical direction (z-direction) in the handler 10 are partially shown by a plan view.

The handler 10 tests (inspects) whether an IC operates suitably in a state applying a high temperature or low temperature thermal stress to the ICs, and classifies the ICs in accordance with the test results. The operating test in the state with a thermal stress being applied is performed by reloading the ICs from a tray (hereinafter, also referred to as a customer tray KT) carrying a large number of ICs to be tested to a test tray TT being conveyed through the inside of the IC testing apparatus 1.

Therefore, the handler of the present embodiment comprises, as shown in the same figure, an IC magazine 100 for storing ICs to be tested from now and also classifying and storing tested ICs, a loader section 200 for conveying the ICs to be tested from the IC magazine 100 to a chamber section 300, the chamber section 300 including a test head, and an unloader portion 400 for classifying and taking out the tested ICs from the chamber section 300.

The IC magazine 100 is provided with a pre-test IC stocker for holding ICs to be tested before being tested and a tested IC stocker for holding ICs classified in accordance with the results of the tests (they are simply referred to as stockers 101 as a general term). FIG. 3 shows by a dotted line the state that the stockers 101 are drawn out.

These pre-test IC stockers and post-test IC stockers 101 are each comprised of a frame-shaped tray support frame 102 and an elevator 103 able to enter from under the tray support frame 102 and move toward the top. The tray support frame 102 supports in it a plurality of stacked customer trays KT (shown by a broken line in the same figure). Only the stacked customer trays KT are moved up and down by the elevator 103.

Note that since the pre-test IC stockers and the post-test IC stockers are the stockers 101 having the same structure, the numbers of the pre-test IC stocker and the post-test IC stocker may be suitably set in accordance with need. In an example shown in FIG. 3, as the pre-test stockers, one stocker STK-B is assigned and one empty stocker STK-E is assigned next it to be sent to the unloader section 400, while as the post-test IC stockers, five stockers STK-1, STK-2, . . . , STK-5 are assigned . Thus, it is possible to hold ICs sorted into a maximum of five classes according to the test results. That is, in addition to classifying ICs as good and defective, the good ICs can be divided into ones with high operating speeds, ones with medium speeds, and ones with low speeds and the defective ICs can be divided into ones requiring retesting, etc.

The above-mentioned customer tray KT is conveyed from the lower side of a test board 105 to an opening 201 of the loader section 200 by a tray transfer arm 104 provided between the IC magazine 100 and test board 105. Then, in the loader section 200, the ICs to be tested loaded on the customer tray KT are transferred once to a preciser 204 by a X-Y-conveyor 202. There, the mutual positions of the ICs are corrected, then the ICs transferred to the preciser 204 are reloaded on a test tray TT stopped at the loader section 200 by using the X-Y conveyor 202 again.

The X-Y conveyor 202 for reloading the ICs from the customer tray KT to the test tray TT is provided with a movable head 203 able to move in the X-Y direction shown in the figure, and the movable head 203 has suction heads attached facing downward (the illustration is omitted). The suction heads move while inhaling air to pick up the ICs from the customer tray KT and reload the ICs on the test tray TT. For example, about eight suction heads are provided for a movable head 203, so it is possible to reload eight ICs at one time on the test tray TT.

Note that the preciser 204 provided between the opening 201 of the loader section 200 and the test tray TT is a position correction means for the ICs to be tested. By dropping the ICs to be tested loaded on the customer tray KT in indentations of the preciser 204 temporarily, mutual positions of the ICs to be tested are decided precisely. The ICs to be tested after the position correction are again picked up by the suction head to be reloaded on the test tray TT, and thereby the ICs to be tested can be reloaded accurately on the IC magazine indentations formed on the test tray TT.

The above test tray TT is sent to the chamber 300 after being loaded with the ICs to be tested by the loader section 200, and the ICs to be tested are tested in the state being carried on the test tray TT.

The chamber section 300 comprises a soak chamber (constant temperature chamber) 301 for giving a desired high temperature or low temperature thermal stress to the ICs to be tested loaded on the test tray TT, a test chamber 302 for making the ICs to be tested contact the test head 304 in the state given a thermal stress in the soak chamber 301, and an exit chamber (heat removing chamber) 303 for removing the given thermal stress from the tested ICs in the test chamber 302.

The soak chamber 301 is provided with a vertical conveyer outside the figure and a plurality of the test trays TT are on standby while being supported by the vertical conveyer until the test chamber 302 becomes emptied. Mainly, a high temperature or low temperature thermal stress is given to the ICs to be tested during being on standby.

A test head 304 is arranged at the center of the test chamber 302, on which the test tray TT is conveyed and a test is carried out by electrically contacting input/output terminals of the ICs to be tested to the contact pins of the test head 304.

In the exit chamber 303, when a high temperature was applied in the soak chamber 301, the ICs are cooled by blowing air to return to the room temperature. Alternatively, when a low temperature of for example about −30° C. was applied in the soak chamber 301, the ICs are heated by hot air or a heater etc. to return them to a temperature of an extent where no condensation occurs. Then, the thus treated ICs are conveyed out to the unloader section 400.

The unloader section 400 is also provided with an X-Y conveyer 402 having almost the same structure with the X-Y conveyer 202 provided to the loader section 200. A movable head 403 provided on the X-Y conveyer 402 reloads the tested ICs from the test tray TT conveyed out from the unloader section 400 to the customer tray KT.

A test board 105 of the unloader section 400 is provided with four openings 401 in order that the customer tray KT conveyed to the unloader section 400 can be brought close to the upper surface of the test board 105. Further, while not illustrated, an elevator table for elevating or lowering a customer tray KT is provided below the respective openings 401. A customer tray KT becoming full after being reloaded with the tested ICs is placed on the table and lowered, and the full tray is passed to the tray transfer arm 104.

Note that in the handler 10 of the present embodiment, while there are a maximum of five types of sortable categories, it is possible to arrange a maximum of only four customer trays KT at the openings 401 of the unloader section 400. Therefore, there is a limit of four sortable categories in real time. Therefore, in the handler 10 of the present embodiment, a buffer section 404 is provided between the test tray TT and the opening 401 of the unloader section 400, and ICs of a category rarely appearing are stored temporarily at this buffer section 404.

Refrigerant Equipment 20

An IC testing apparatus 1 of the present embodiment comprises a refrigerant equipment 20 for supplying cold air to the soak chamber 301 and the test chamber 302 of the above handler 10. The refrigerant equipment 20 is used at the time of giving a low temperature thermal stress to the ICs to be tested and comprises therein a refrigerating cycle 210 and a cold air applying line 220.

The refrigerating cycle 210 is mainly connected to a compressor 211 driven by an electric motor for inhaling and compressing a refrigerant to a high temperature high pressure gas, a condenser 212 for condensing and liquidating the high temperature high pressure gas by a heat exchange with the outside air to make a low temperature high pressure gas-liquid mixture refrigerant, a receiver tank 213 for separating the gas-liquid mixture refrigerant to take out only a liquid refrigerant, an expansion valve 214 for rapidly expanding the high pressure liquid refrigerant to make it a low temperature low pressure mist state refrigerant, and an evaporator 215 for cooling the air by using the low temperature low pressure mist state refrigerant, so as to configure a closed loop circuit by a refrigerant pipes 216.

Figure 1:
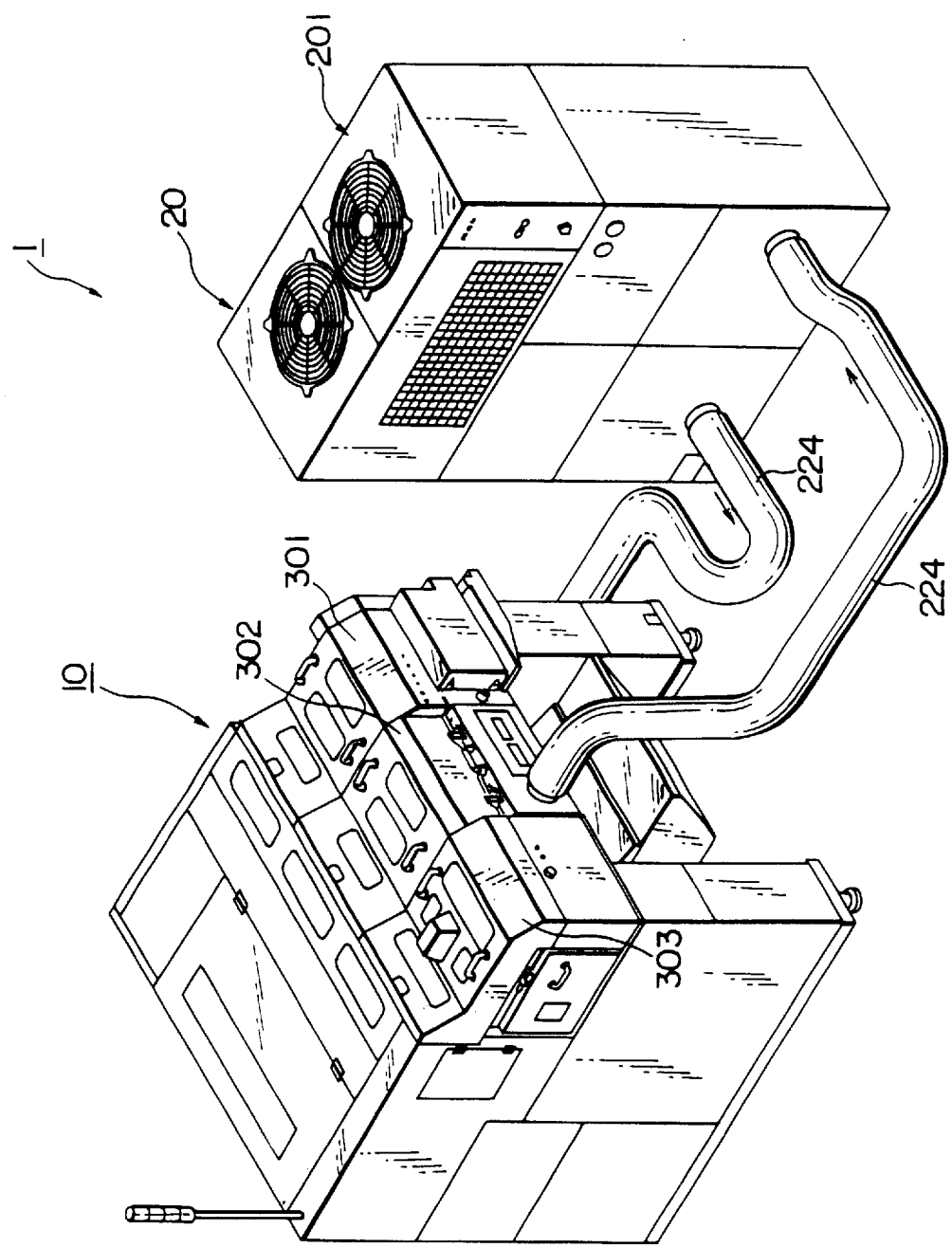
FIG. 1 is a perspective view of an embodiment of an IC testing apparatus of the present invention.

The condenser 212 has a fan 217 for inhale air from the outside (from the ceiling) of the casing 201 as shown in an exterior view of FIG. 1 for cooling a high temperature refrigerant. Also, the expansion valve 214 has a temperature sensing tube 218 for detecting the temperature of the refrigerant at the outlet side of the evaporator 215. When the temperature detected by the temperature sensing tube 218 is high (that is, when a heat load of the evaporator 215 is large), the expansion valve 214 is opened more to increase the refrigerant supply amount to the evaporator 215. Alternately, when the temperature of the refrigerant at the outlet side of the evaporator 215 is low, the heat load of the evaporator 215 is not very large, so the expansion valve is opened less to suppress the refrigerant supply amount to the evaporator 215.

On the other hand, the cold air apply line 220 supplies air to the evaporator 215 of the refrigerating cycle 210 for cooling the air, and configures a closed loop of supplying the thus cooled air to the soak chamber 301 of the handler 10 and returning the cold air from the soak chamber 302 to the refrigerant equipment 20 again.

Therefore, the cold air applying line 220 is provided with ducts 222 and 224 having a blower 223. When the blower 223 starts to operate, the blowing air is sent to the evaporator 215 through the internal duct 222 and cooled by a heat exchange. The outlet side of the blower 223 and the soak chamber 301 of the handler 10 are connected by the external duct 224, further, the test chamber 302 and the inlet side of the evaporator 215 are connected by the external duct 224. The cold air cooled in the evaporator 215 is then supplied to the soak chamber 301 through the internal duct 222 and the external duct 224, and again supplied to the evaporator from the test chamber 302 through the external duct 224 and the internal duct 222.

Note that at the time of applying a low temperature thermal stress, the cold air is circulated by making the cold air applying line 220 a closed loop as explained above, while when testing of the ICs is completed and the inside of the chamber section 300 is restored to be the normal temperature, air of the normal temperature is taken in from an inlet 221 provided on the side surface of the casing 201 for taking in the room air or from an inlet 225 connected to a compression air pipe in the plant, and the cold air in the cold air applying line 220 is discharged to the room from an outlet 226 provided on the side surface of the casing 201. The cold air applying line 220 is provided with switching valves 227a to 227d for switching such air paths.

The refrigerant equipment 220 of the present embodiment is further provided with an electric heater (corresponding to the heating unit of the present invention) 228 at the duct 222 in the downstream side of the evaporator 215 for making fine adjustments to the temperature of the air cooled in the evaporator 215. This is used when controlling of the temperature of the cold air only by the evaporator 215 is difficult, and is not necessarily always used. For example, a low temperature thermal stress includes a test carried out under an extremely low temperature condition like −30° C. and a test carried out under a low temperature condition of about −10° C. to 0° C.

Accordingly, the refrigerant capability by the refrigerating cycle 210 is required to be able to realize the extremely low temperature conditions of −30° C., while when the refrigerant cycle is used for the low temperature condition of about −10° C., the refrigerant capability is too high. In such a case, the electric heater 228 is used for heating the excessively cooled air to the desired temperature in the evaporator 215 for being supplied to the soak chamber 301.

Also, in the present embodiment, a temperature sensor 229 is provided for detecting the temperature inside the soak chamber 301, and thereby mainly the electric heater 228 is controlled based on the actual temperature measured by the temperature sensor 229.

Note that the blower 223 of the present embodiment is capable of performing an inverter controlling, so the temperature can be controlled to a certain extent by adjusting the amount of the cold air supplied to the soak chamber 301.

Further, in the IC testing apparatus 1 of the present embodiment, the handler 10 and the refrigerant equipment 20 exchange a control signal and the refrigerant equipment 20 is to be set and monitored mainly by the handler 10 side. Namely, an input means of an applying temperature by the refrigerant equipment 20 is provided in the handler 10, and the set temperature and the actual temperature data by the above temperature sensor 229 are sent to the controller of the refrigerant equipment. An operation instruction signal and a stop instruction signal are also sent from the handler 10 to the refrigerant equipment 20, and start and stop of an operation of the refrigerant equipment 20 is operated by the handler 10 side. On the other hand, a signal indicating operation conditions of the refrigerant equipment 20 is sent to the handler 10 side from the refrigerant equipment 20 side, and when an abnormality occurs in the refrigerant equipment 20, a stop instruction signal is sent from the handler 10.

In addition to this, when restoring the chamber 300 of the handler 100 to the normal temperature and when carrying out a defrost operation on the refrigerant equipment 20, the two exchange a control signal so as to interlock the normal temperature restoring operation and the defrost operation. The detailed operation will be explained later on.

In the IC testing apparatus 1 of the present embodiment, the connection portion of the external duct 224 and the handler 10 are configured as follows.

Figure 4:
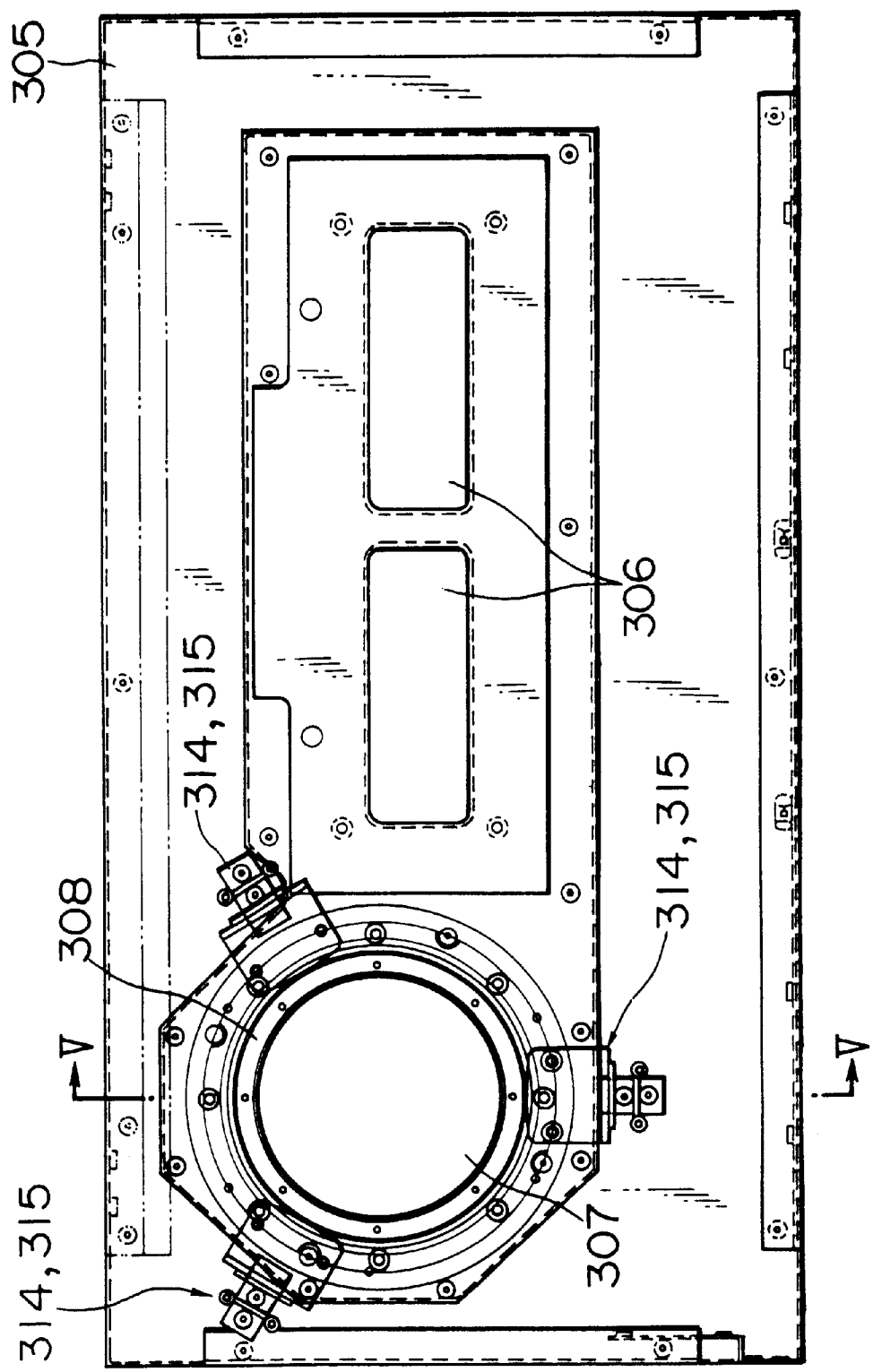
FIG. 4 is a view from the front of a connection part of a duct.
Figure 5:
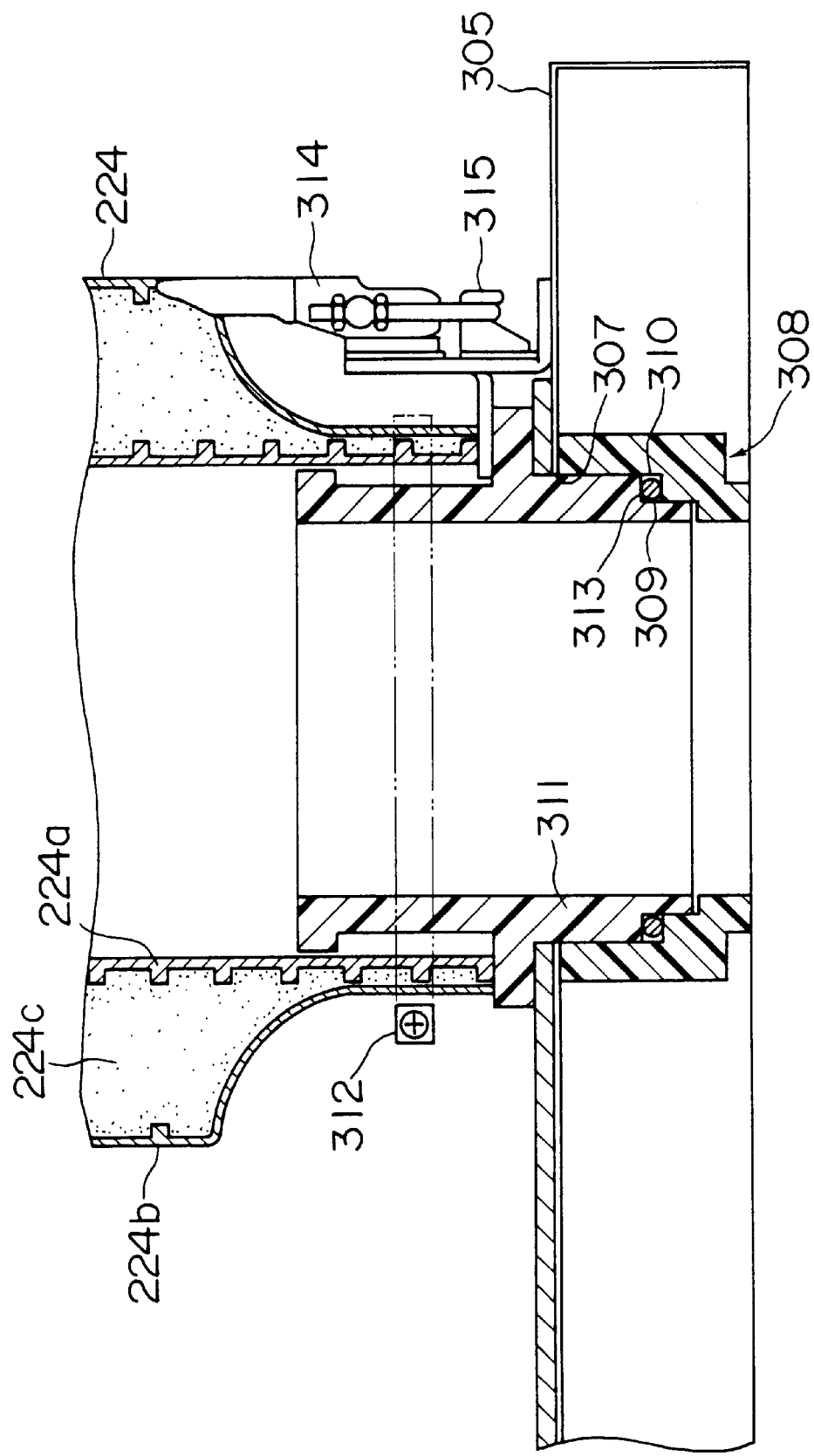
FIG. 5 is a sectional view along the line V—V in FIG. 4.

FIG. 4 is a view from the front showing the connection structure of a chamber door 305 of the chamber section 300 of the handler 10 and the duct 224, and FIG. 5 is a sectional view along the line V—V in FIG. 4. Note that one duct connection portion (outlet side of the cold air) of the chamber section 300 is shown in FIG. 4. The connection portion (inlet side of the cold air) of the external duct 224 and the soak chamber 301 is adopted the same structure, as well.

First, as shown in FIG. 4 and FIG. 5, the chamber door 305 is attached able to be opened and closed on the side wall of the chamber section 300. An opening 306 is formed on the chamber door 305 for inspecting the inside of the chamber section 300. Also, an air through hole 307 is formed on the chamber door 305 to reach to the inside of the chamber section 300. A first housing 308 is fixed to the air through hole 307 by a not shown bolt.

The first housing 308 is a housing made by synthetic resin having a circular through hole corresponding to the air through hole 307, on which a step portion 310 is formed for sandwiching an O-ring 309 (corresponding to the sealing body of the present invention) which will be explained later on. As a synthetic resin, for example an epoxy-resin strengthened by glass fibers can be mentioned.

On the other hand, the second housing 311 for being inserted to the above first housing 308 is fixed on one end of the external duct 224 by a tightening band 312. Since the external duct 224 and the second housing 311 are not required to be detached, they are airtightly tightened by a tightening band 312. The second housing 311 is also formed a circular through hole corresponding to the air through hole 307, composed of a glass fiber strengthened epoxy, etc. and being formed a step portion 313 for sandwiching the O-ring 309 by operating together with the above step portion 310 of the first housing 308. Note that the O-ring 309 was used as a sealing body in the present embodiment, however, any member can replace it as far as it is capable of securing an air tightness between the first and second housings 308 and 311. For example, a silicone sponge, etc. can be used as a substitute.

A toggle clamp lever 314 is fixed to the second housing 311 and a toggle clamp hook 315 is fixed on the first housing 308 side, on a chamber door in this example, so as to joint the second housing 311 fixed to one end of the external duct 224 to the fist housing 308 fixed to the chamber door 305. The toggle clamp lever 314 and the toggle clamp hook 315 are, as shown in FIG. 4, provided three pairs equally distributed in the circumference direction of the first and second housings 308 and 311. By setting by hooking the toggle clamp lever 314 on the toggle clamp hook 315 after inserting the second housing 311 to the first housing 308, the fist and second housings 308 and 311 are relatively compressed, consequently hold the O-ring between them.

Note that as a means to attach and detach the first and second housings 308 and 311 by a touch of an operation, for example a mechanism like a crescent can be adopted in addition to the toggle clamps 314 and 315 in the present example. Also, although the toggle clamp lever 314 was provided to the second housing 311 and the toggle clamp hook was provided to the first housing 308 in the present example, they can be provided oppositely, as well. Further, although the toggle clamp hook 315 was fixed to the chamber door 305 in the present example, one of the toggle lamp may be fixed directly or indirectly at least to the first housing 308.

Note that the external duct 224 has a structure of interposing a heat insulating member 224c between an internal seat body 224a and an external seat body 224b, and thereby condensation due to cold air can be prevented.

The actions will be explained next.

When carrying out an operation test by applying a low temperature thermal stress to ICs to be tested, the external duct 224 is first connected to the handler 10. In this case, the second housing 311 fixed to the end of the external duct 224 is inserted in the axis direction into the first housing 308 fixed to the handler 10 side, and the toggle clamps 314 and 315 are set. By doing so, the air tightness between the first and second housings 308 and 311 are secured, the connecting operation can be done instantly, furthermore, even when the external duct 224 has to be detached, only detaching of the toggle clamps 314 and 315 would be sufficient. Especially, connecting of the first housing 308 and the second housing 311 can be done only by inserting in the axis direction, so the O-ring interposed between them is not twisted. Thus, the durability and the sealing property of the O-ring can be sufficiently secured. Note that when the refrigerant equipment 20 is not necessary like in the cases of a high temperature thermal stress test and a normal temperature test, the second housing 311 is removed and a plug which closes the circular through hole by a substantially the same shape is attached instead.

After connecting the external duct 224 to the handler 10, setting for using the refrigerant equipment 20 is carried out on the handler 10 side, and then a temperature to be applied is set and a starting button of the refrigerant equipment 20 is input. As a result, the set temperature is sent from the handler 10 to the refrigerant equipment 20 side together with the operation start signal.

In the refrigerant equipment 20, when the operation start signal is received, the compressor 211 and a condenser fan 217 start to operate and the refrigerating cycle starts to operates, at the same time, the blower 223 also starts to operate and the air is circulated.

When the compressor 211 starts to operate, the refrigerant inhaled in the compressor 211 is compressed and becomes a high temperature high pressure gas, then cooled in the condenser 212 and becomes a low temperature high pressure gas-liquid mixture refrigerant. Only a liquid refrigerant is extracted from the gas-liquid mixture refrigerant in the receiver tank 213 and sent to the expansion valve 214. The expansion valve 214 rapidly expands the high pressure liquid refrigerant to make it a low temperature low pressure mist state refrigerant and sends the same to the evaporator 215.

While, supply of the cold air to the soak chamber 301 is carried out after opening the switching valve 227c and closing the switching valves 227a, 227b and 227d (the switching valve 227b may be opened). A heat exchange is performed by passing air through the evaporator 215 wherein the low temperature low pressure mist state refrigerant flows and a cold air of for example −30° C. is supplied to the soak chamber 301. Since the soak chamber 301 and the test chamber 302 are connected, the cold air supplied in the soak chamber 301 flows into the test chamber 302 while cooling the ICs to be tested (carried on the test tray TT) transferred in the soak chamber 301, then returns to the evaporator 215 via the external duct 224 and is cooled again.

At this time, the actual temperature is taken by the temperature sensor 229 provided inside the soak chamber 301 and sent from the handler 10 to the refrigerant equipment 20 and feedback to the operation of the electric heater 228. For example, when the actual temperature of the soak chamber 301 is lower than the set temperature (reference temperature), the cold air which is cooled excessively is heated by an operation of the electric heater 228 and supplied to the soak chamber 301. Such actual temperature data is sent from the handler 10 to the refrigerant equipment 20 at certain intervals and the above electric heater is controlled each time.

When the actual temperatures of the soak chamber 301 and the test chamber 302 reach the conditions, test of the ICs to be tested starts. During the test, operation conditions of the refrigerant equipment itself, for example, whether the compressor 211, condenser fan 217, blower 223, electric heater 228 and other components are operating normally, is sent to the handler 10 side from the refrigerant equipment 20. If an abnormality occurs, an operation stop instruction signal is sent to the refrigerant equipment 20 from the handler 10 to stop the refrigerant equipment 20, and at the same time, an alarm is issued to notify a user of it. When the alarm is released, an operation start instruction signal is sent to the refrigerant equipment 20 again from the handler 10 to restart the test.

Figure 6:
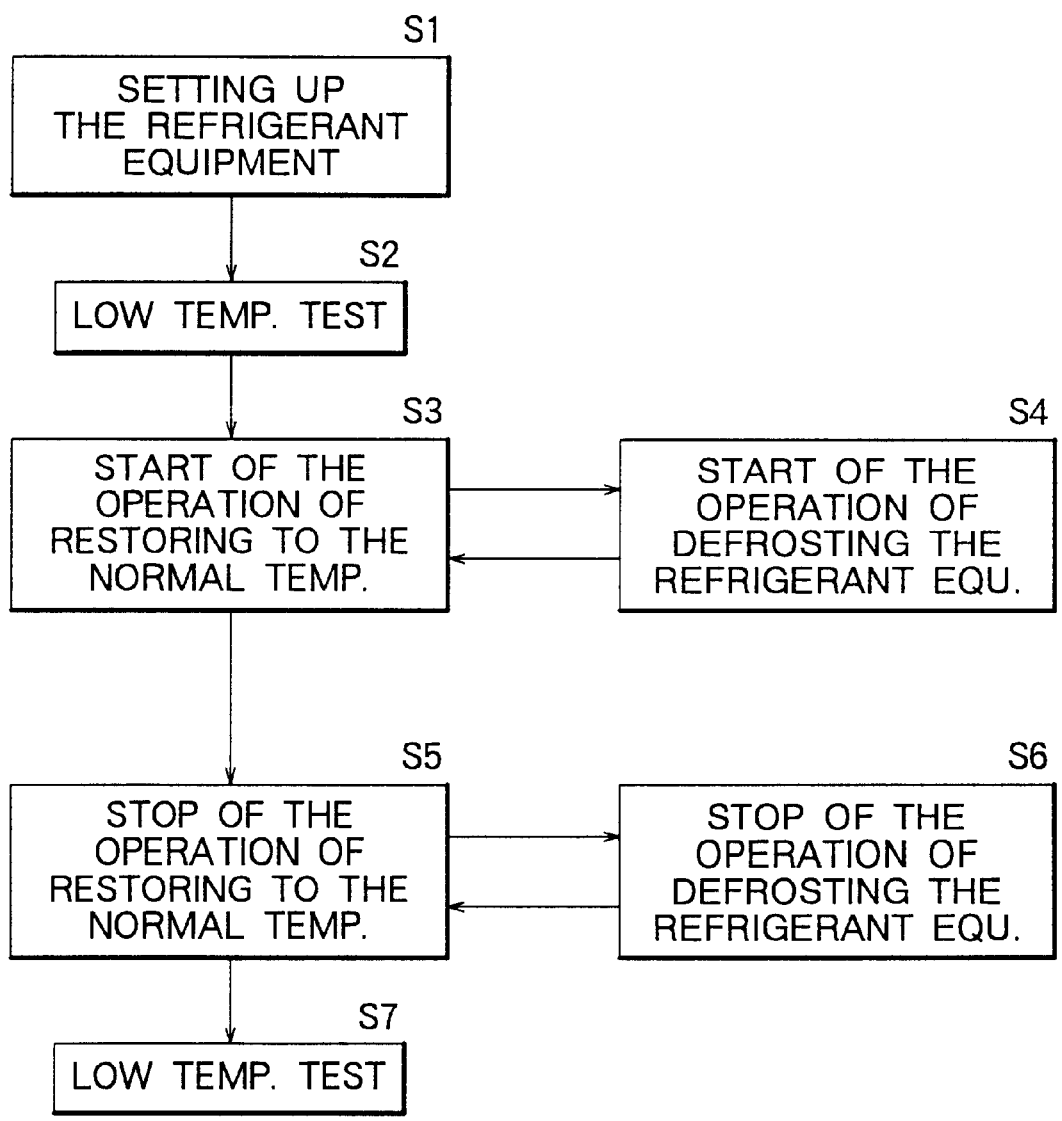
FIG. 6 is a flow chart of an operation of an IC testing apparatus of the present invention.

The above is the operation of the low temperature test in steps 1 and 2 shown in FIG. 6. An operation of when transferring to a test of the next ICs to be tested after temporarily stopping the low temperature test will be explained, next.

FIG. 6 is a flow chart of the overall operation of the IC testing apparatus of the present embodiment, wherein, as shown in steps 3 and 4, and steps 5 and 6, start of the operation of restoring the handler 10 to the normal temperature and start of the operation of defrosting the refrigerant equipment 20 are interlocked, and also stop of the operation of restoring the handler 10 to the normal temperature and stop of the defrost operation on the refrigerant equipment 20 are interlocked.

Figure 7:
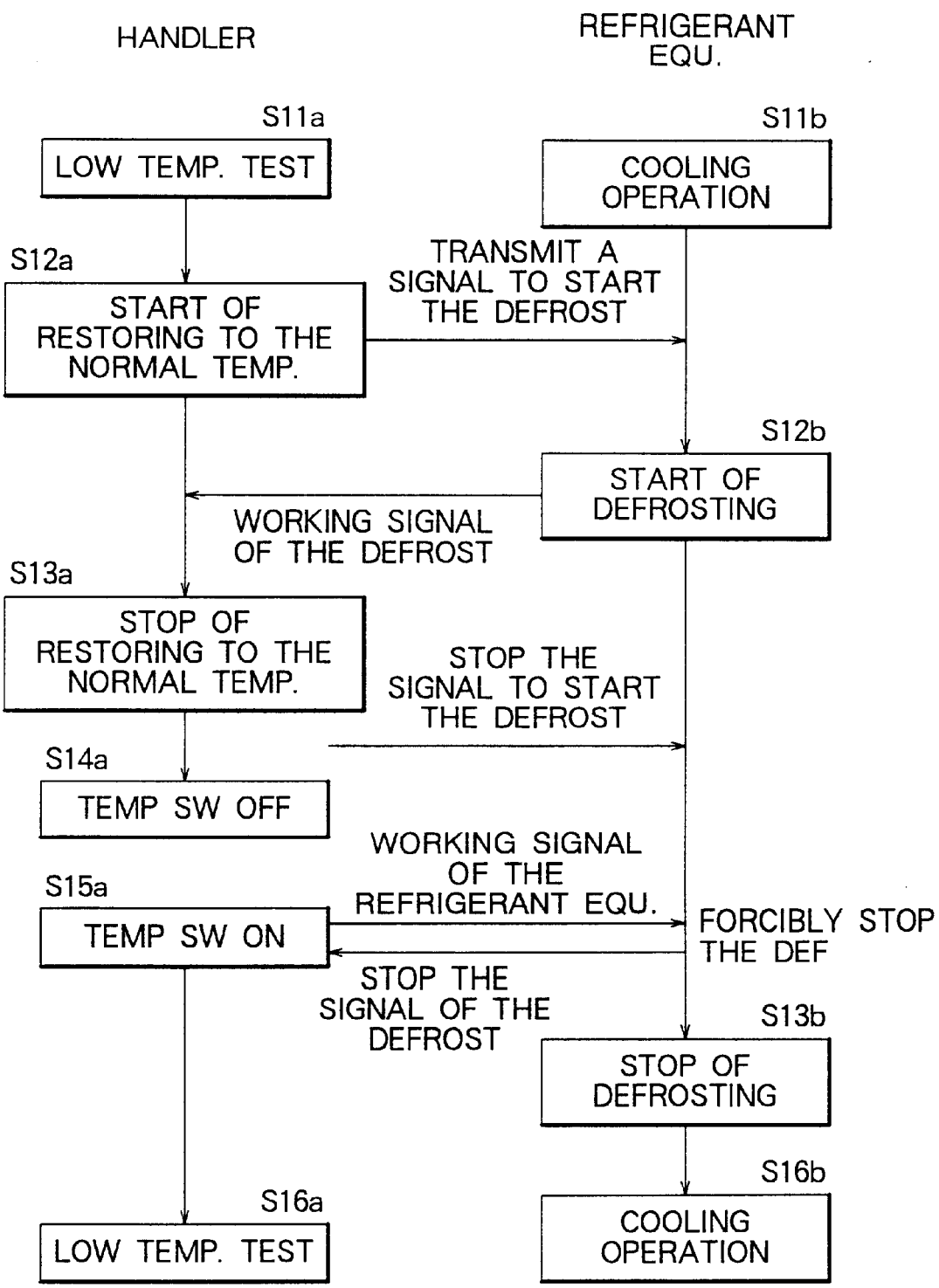
FIG. 7 is a flow chart of an interlock of an normal temperature restoring operation on a handler and a defrost operation on a refrigerant equipment in the IC testing apparatus of the present invention.
Figure 8:
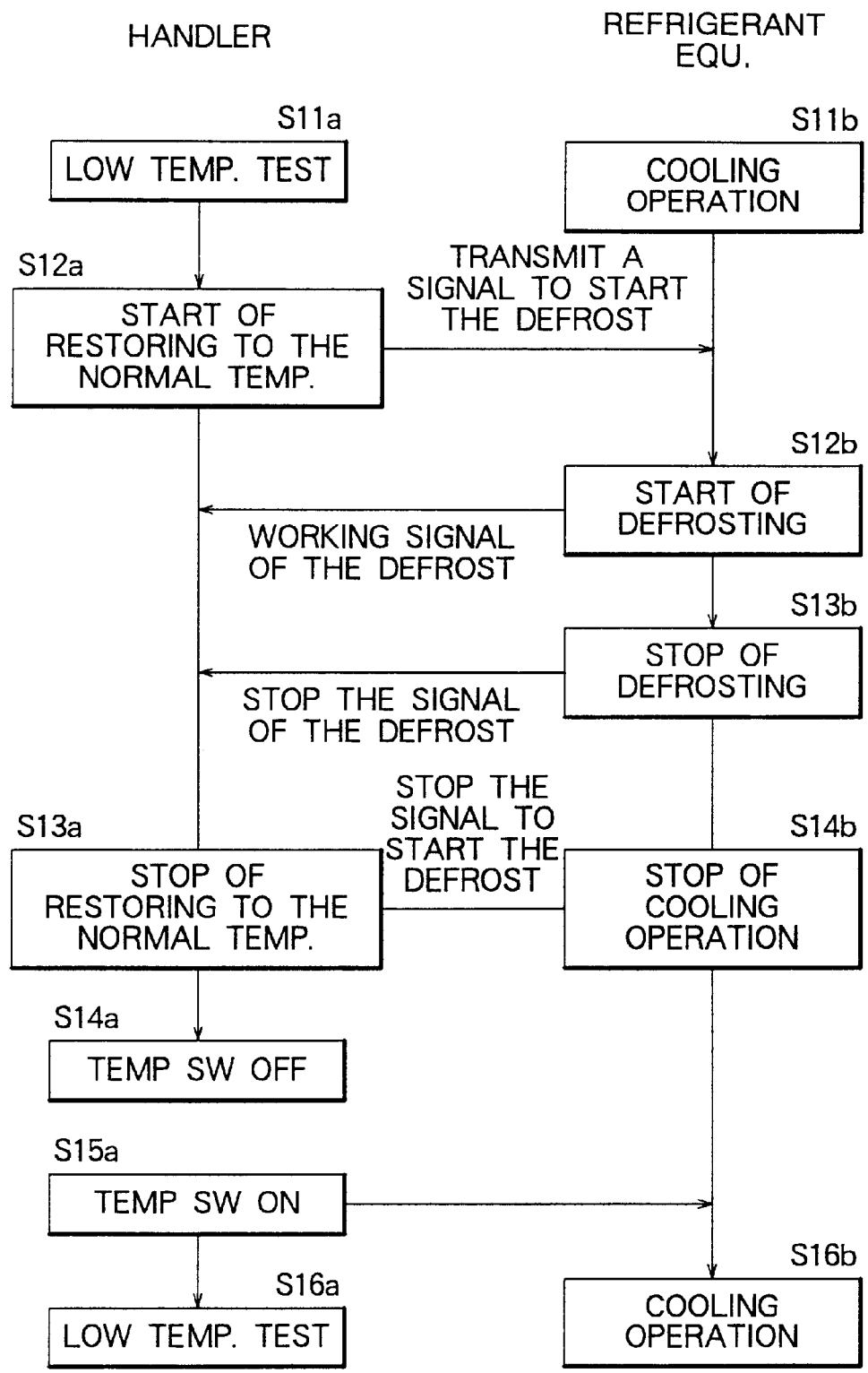
FIG. 8 is a flow chart of an interlock of a normal temperature restoring operation on a handler and a defrost operation on a refrigerant equipment in the IC testing apparatus of the present invention.
Figure 9:
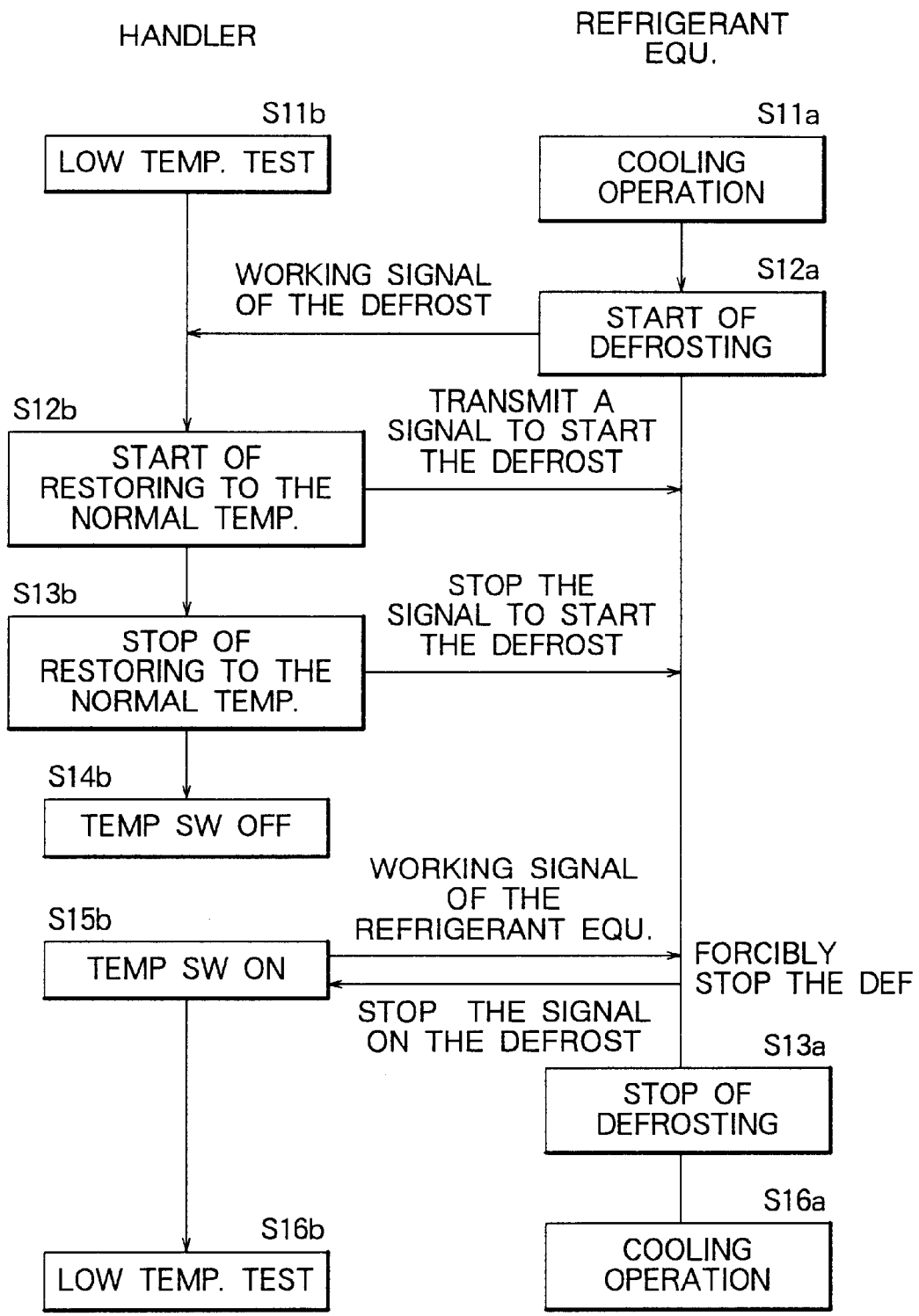
FIG. 9 is a flow chart of an interlock of a normal temperature restoring operation on a handler and a defrost operation on a refrigerant equipment in the IC testing apparatus of the present invention.
Figure 10:
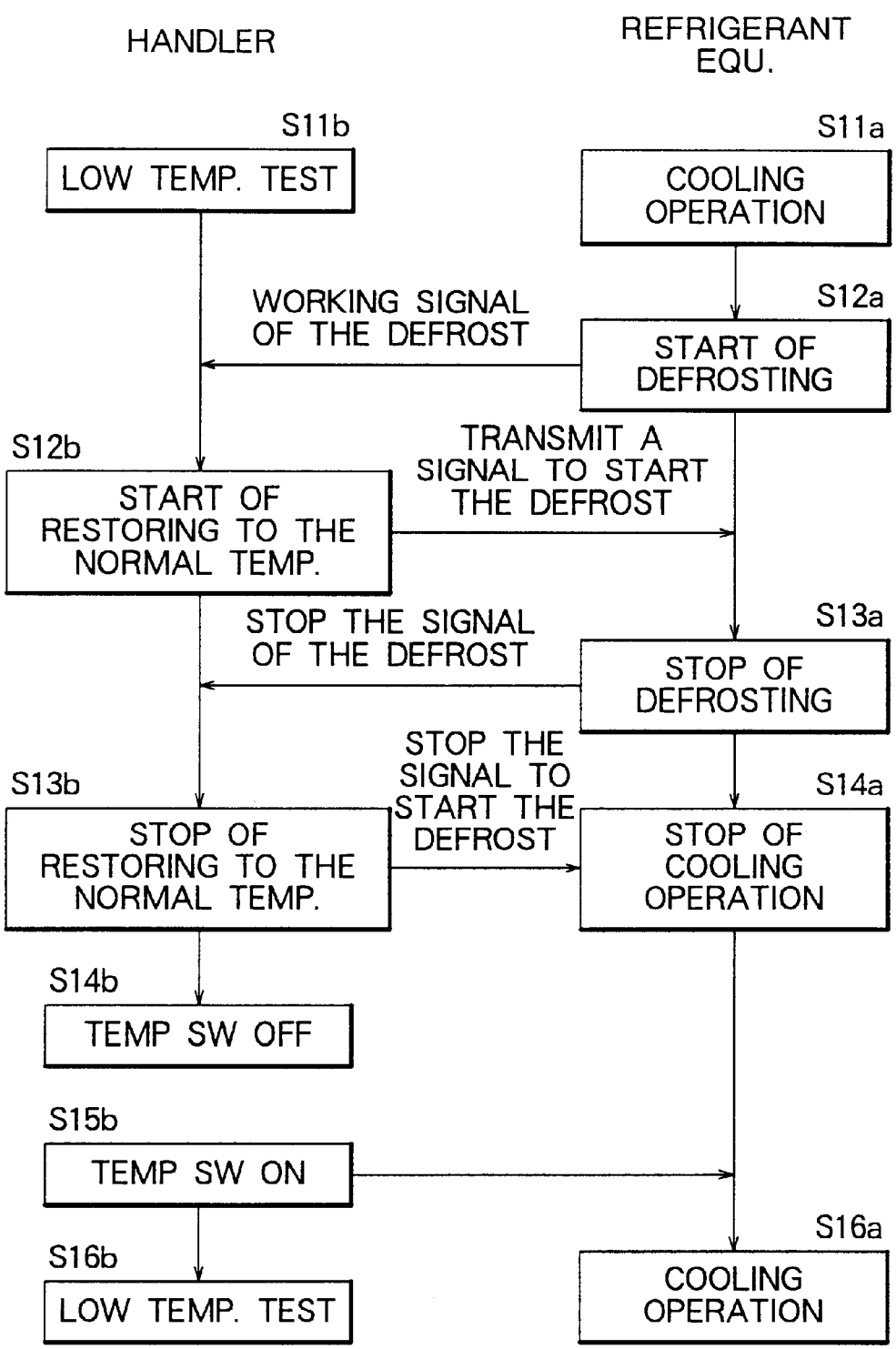
FIG. 10 is a flow chart of an interlock of a normal temperature restoring operation on a handler and a defrost operation on a refrigerant equipment in the IC testing apparatus of the present invention.

FIGS. 7 to 10 are flow charts of the interlock of the normal temperature restoring operation of the handler 10 and the defrost operation of the refrigerant equipment 20. FIGS. 7 and 8 show a routine wherein the defrost operation starts and stops on the refrigerant equipment 20 in accordance with start and stop of the normal temperature restoring operation on the handler 10 side, whereas FIGS. 9 and 10 show a routine wherein the normal temperature restoring operation of the handler 10 starts and stops in accordance with start and stop of the defrost operation of the refrigerant equipment 20.

First, FIG. 7 is a case where the defrost operation of the refrigerant equipment 20 starts and stops in accordance with the start and stop of the normal temperature restoring operation on the handler 10 side and the time for normal temperature restoring operation is shorter than the time for the defrost operation of the refrigerant equipment 20. As shown in the figure, in the state the handler 10 is performing a low temperature test (Step 11a), when an instruction to start the normal temperature restoring operation on the handler 10 is input (Step 12a), an instruction signal to start the defrost operation is sent form the handler 10 to the refrigerant equipment 20 in response to the instruction. In the refrigerant equipment 20, the defrost operation starts in response to the instruction signal from the handler 10 (Step 12b) and a signal indicating that the defrost operation has started is sent to the handler 10 side at the same time.

Figure 2:
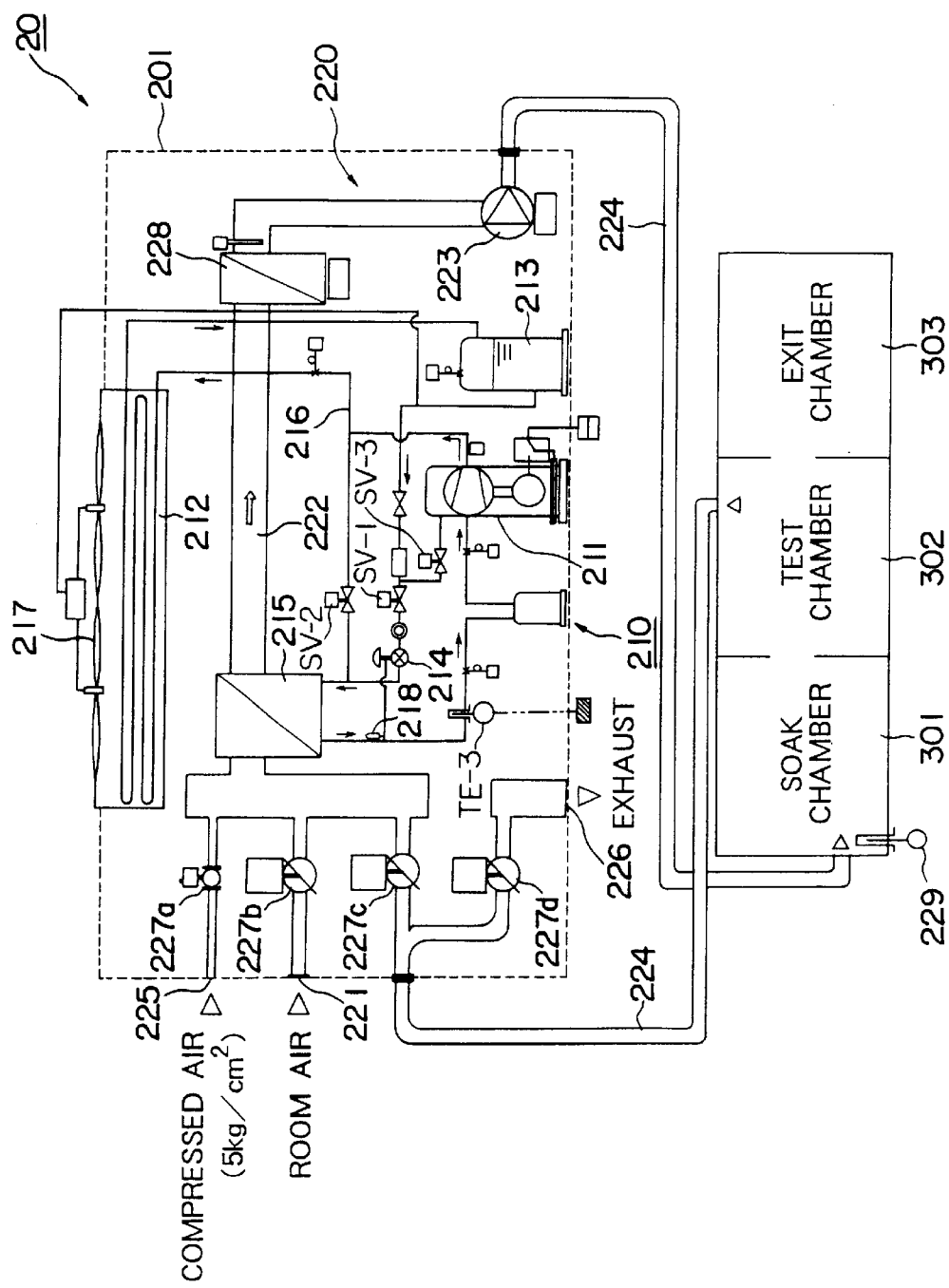
FIG. 2 is a circuit diagram of a refrigerating cycle and a cold air applying line in FIG. 1.

On the refrigerant equipment 20 side, by shortening/short-circuiting the outlet of the compressor 211 and the inlet of the evaporator 215 by opening an electromagnetic valve SV-2 shown in FIG. 2, a high temperature gas is introduced from the compressor 211 to the evaporator to defrost mainly from the expansion valve 214 to the accumulator. Further, in response to the start signal of the normal temperature restoring operation input to the handler 10, the switching valve 227c on the refrigerant equipment 20 side closes and the switching valve 227d opens to discharge the cold air in the chamber section 300 to the outside the refrigerant equipment 20 through the external duct 224 and the outlet 226. At this time, a compressed air or the room air is introduced to the cold air applying line 220 by opening the switching valves 227a and 227b to introduce the normal temperature air to the chamber section 300, as a result, the chamber section 300 returns to the normal temperature.

When the chamber section 300 of the handler 10 returns to the normal temperature (Step 13a), an instruction signal to stop the defrost operations sent to the refrigerant equipment 20 side, and then, a temperature applying switch is turned off (Step 14a). When the instruction signal to stop the defrost operation sent from the handler 10 side is received, the refrigerant equipment 20 may forcibly stop the defrost operation or set a timer for a certain period of time and continue the defrost operation further for the set period of time. Note that when the temperature applying switch is again input from the handler 10 to start the next low temperature test (Steps 15a and 16a), the defrost operation stops (Step 13b) and the cooling operation starts (Step 16b).

FIG. 8 shows a case where the defrost operation of the refrigerant equipment 20 starts and stops in accordance with the start and stop of the normal temperature restoring operation of the handler 10 side and the time for restoring the handler 10 to the normal temperature is longer than the time for the defrost operation of the refrigerant equipment 20.

In this case, when an instruction to start the normal temperature restoring operation is input to the handler 10 (Step 12a), an instruction signal to start the defrost operation is sent to the refrigerant equipment 20 from the handler 10 in response to the instruction, and the defrost operation starts in the refrigerant equipment 20 (Step 12b). However, the defrost operation ends before the handler 10 returns to the normal temperature (Step 13b), thus, while a signal indicating the defrost operation ended is sent to the handler 10 side, the refrigerant equipment 20 stops in response to a signal to stop the defrost operation (Step 14b) which is sent from the handler 10 when the normal temperature restoring operation ended on the handler 10 side (Step 13a).

FIG. 9 shows a case where the handler 10 side starts and stops the normal temperature restoring operation in response to the start and stop of the defrost operation on the refrigerant equipment 20 side and the time for restoring the handler 10 to the normal temperature is shorter than the time for defrost operation of the refrigerant equipment 20. As shown in the figure, in the state the refrigerant equipment 20 is performing a refrigerating operation (Step 11a), when an instruction to start the defrost operation is input to the refrigerant equipment 20 (Step 12a), an instruction signal indicating that the defrost operation has started is sent to the handler 10 from the refrigerant equipment 20 in response to the instruction. The normal temperature restoring operation starts in the handler 10 in response to the signal from the refrigerant equipment 20 (Step 12b) and a signal to start the defrost operation is sent to the refrigerant equipment 20 side.

When the normal temperature restoration ends on the handler 10 side (Step 13b), an instruction signal to stop the defrost operation is sent to the refrigerant equipment 20 side and the temperature applying switch is turned off (Step 14b). When the instruction signal sent from the handler 10 side to stop the defrost operation is received, the refrigerant equipment 20 may forcibly stop the defrost operation or set a timer for a certain period of time and continue the defrost operation further for the set period of time. Note that when the temperature applying switch is again input from the handler 10 to start the next low temperature test (Steps 15b and 16b), the defrost operation stops (Step 13a) and the cooling operation starts (Step 16a).

Note that it is by a manual operation or a case where a heat load in the evaporator 215 is small and a low pressure switch provided on the inhaling side of the compressor 211 starts operating, etc. when an instruction to start the defrost operation is input to the refrigerant equipment 20 side. It is because in such a case of a small load, a heat exchange is not carried out sufficiently in the evaporator 215 and frosting sometimes occurs in the evaporator.

FIG. 10 shows a case where the handler 10 side starts and ends the normal temperature restoring operation in accordance with the start and stop of the defrost operation of the refrigerant equipment 20 as same in the case of FIG. 9, however, the time for restoring the handler 10 to the normal temperature is longer than the time for the defrost operation of the refrigerant equipment 20.

In this case, when an instruction to start the defrost operation is input to the refrigerant equipment 20 (Step 12a), an instruction signal indicating the defrost operation has started is sent to the handler 10 from the refrigerant equipment 20 in response to the instruction, and the normal temperature restoring operation starts on the handler 10 side (Step 12b). Since the defrost operation ends before the handler 10 returns to the normal temperature (Step 13a), a signal indicating the defrost operation has ended is sent to the handler 10 side, but the refrigerant equipment 20 stops in response to a signal to stop the defrost operation (Step 14a) which is sent from the handler 10 when the normal temperature restoring operation has ended on the handler 10 side (Step 13b).

Note that the embodiments explained above were described to facilitate the understanding of the present invention and not to limit the present invention. Accordingly, elements disclosed in the above embodiments include all design modifications and equivalents belonging to the technical field of the present invention.

For example, the handler 10 in the present invention is not particularly limited to the above type and other types of handlers are included in the range of the present invention. Also, the specific configuration of the refrigerating cycle 210 and cold air applying line 220 shown in FIG. 2 are not particularly limited and able to be suitably modified.

What is claimed is:

1. An IC testing apparatus for testing by applying at least a low temperature thermal stress to an electronic device to be testing comprising:

a refrigerant cycle wherein at least a compressor, a condenser, an expansion valve and an evaporator are connected in this order by a refrigerant line;

a cold air applying line having a blower for supplying heat exchanged air by the evaporator to the pre-test electronic device to be tested, wherein said cold air applying line supplies cold air cold air to either one of a soak chamber for raising or lowering a temperature of the electronic device to be tested and a test chamber for testing the electronic device to be tested and discharges the same from the other.

2. The IC testing apparatus as set forth in claim 1, wherein said cold air applying line further comprises a heating unit for heating the heat exchanged air by the evaporator.

3. The IC testing apparatus as set forth in claim 1 or claim 2, further comprising:

an input means for inputting a set temperature;

a temperature sensor provided on at least either one of the test chamber or the soak chamber; and a control means for controlling a temperature of the cold air supplied from said cold air applying line based on an actual temperature detected by said temperature sensor and the set temperature input to the input means.

4. The IC testing apparatus as set forth in claim 3, wherein said control means controls the temperature of the cold air supplied from said cold air applying line by controlling the blower and/or said heating unit.

5. The IC testing apparatus as set forth in claim 2, further comprising:

operation condition detection means for detecting operation conditions of at least either one of said refrigerant cycle or said cold air applying line, and control means for controlling start or stop of an operation of said refrigerant cycle or said cold air applying line based on an output of said operation condition detection means.

6. An IC testing apparatus, comprising:

a handler for transferring an electronic device to be tested to a test portion and classifying the electronic device after performing at least a low temperature test in response to a result of the test; and a refrigerant equipment having a refrigerant cycle and a cold air applying line for supplying heat exchanged air by the refrigerating cycle to a pre-test electronic device to be tested;

wherein the normal temperature restoring operation of said handler and the defrost operation of said refrigerant equipment are interlocked to be carried out.

7. The IC testing apparatus as set forth in claim 6, wherein:

when said handler carries out a normal temperature restoring operation, an instruction signal to start a defrost operation is sent from said handler to said refrigerant equipment.

8. The IC testing apparatus as set forth in claim 6 or claim 8, wherein:

when said refrigerant equipment carries out a defrost operation, an instruction signal to start the normal temperature restoring operation is sent from said refrigerant equipment to said handler.

9. The IC testing apparatus as set forth in claim 6, wherein:

when said handler completes restoration to a normal temperature, an instruction signal to stop defrost operation is sent from said handler to said refrigerant equipment.

10. An IC testing apparatus, comprising:

a handler for transferring an electronic device to be tested to a temperature applying chamber and after performing a test by applying a thermal stress, classifying the electronic device to be tested in accordance with a results of the test;

a temperature applying equipment for generating cold air or hot air to be supplied to the temperature applying chamber;

a duct connected between said handler and said temperature applying equipment;

a first housing provided at an air through hole formed in the temperature applying chamber of said handler, to which an end of said duct is connected;

a second housing attached to the one end of said duct and is jointed to said first housing via a sealing body; and fixing means for fixing said first housing and said second housing by tightening.

11. The IC testing apparatus as set forth in claim 10, wherein:

said first housing and said second housing are formed by a synthetic resin.

12. The IC testing apparatus as set forth in claim 11 or claim 12, wherein:

the one end of said duct is airtightly attached to said second housing via a tightening band.

* * * * *